United States Patent
McCullough

(10) Patent No.: US 6,803,328 B2
(45) Date of Patent: Oct. 12, 2004

(54) PRINT THERMALLY CONDUCTIVE INTERFACE ASSEMBLY

(75) Inventor: Kevin A. McCullough, N. Kinstown, RI (US)

(73) Assignee: Cool Shield, Inc., Warwick, RI (US)

(*) Notice: Subject to any disclaimer, the term of this patent is extended or adjusted under 35 U.S.C. 154(b) by 0 days.

(21) Appl. No.: 10/287,194

(22) Filed: Nov. 4, 2002

(65) Prior Publication Data

US 2003/0057547 A1 Mar. 27, 2003

Related U.S. Application Data

(62) Division of application No. 09/904,050, filed on Jul. 12, 2001, now Pat. No. 6,555,486.

(51) Int. Cl.[7] .............................................. H01L 21/31
(52) U.S. Cl. ...................... 438/781; 438/782; 438/783; 438/720
(58) Field of Search ................................ 257/703, 712, 257/713, 675, 787, 795; 438/781–783, 720

(56) References Cited

U.S. PATENT DOCUMENTS

| | | | |
|---|---|---|---|
| 4,938,279 A | | 7/1990 | Betker .......................... 165/46 |
| 4,981,743 A | * | 1/1991 | Ho ............................. 428/65.1 |
| 4,999,741 A | | 3/1991 | Tyler ........................... 361/387 |
| 5,171,606 A | * | 12/1992 | Mayer et al. ................ 427/162 |
| 5,440,172 A | | 8/1995 | Sutrina ......................... 257/712 |
| 5,660,917 A | | 8/1997 | Fujimori et al. ............. 428/195 |
| 5,738,936 A | | 4/1998 | Hanrahan ................. 428/313.5 |
| 5,781,412 A | | 7/1998 | de Sorgo ..................... 361/704 |
| 5,922,783 A | | 7/1999 | Wojciak ........................ 522/18 |
| 5,968,606 A | * | 10/1999 | Osuna et al. ................ 427/510 |
| 6,204,303 B1 | | 3/2001 | Osuna et al. .................. 522/71 |
| 6,210,520 B1 | * | 4/2001 | Osuna et al. ............. 156/306.3 |
| 6,329,224 B1 | * | 12/2001 | Nguyen et al. .............. 438/127 |
| 6,541,874 B2 | * | 4/2003 | Nguyen et al. .............. 257/787 |
| 2002/0006718 A1 | * | 1/2002 | Distefano .................... 438/617 |
| 2002/0123230 A1 | * | 9/2002 | Hubacek ...................... 438/712 |

* cited by examiner

Primary Examiner—Luan Thai
(74) Attorney, Agent, or Firm—Barlow, Josephs & Holmes, Ltd.

(57) ABSTRACT

A novel visible light curable composition for forming a thermally conductive interface and a method of using the same is provided. The composition is used to promote the transfer of heat from a source of heat such as an electronic device to a heat dissipation device such as a heat sink. The composition includes an elastomeric base matrix containing a light curable catalyst, loaded with a thermally conductive filler material such as boron nitride grains or ceramic filler. After the compound is prepared, it is screen or stencil printed onto the desired surface and cured by exposure to visible light. The thermal interface is bonded to the desired surface and has sufficient compressibility to allow it to overcome the voids in the mating surface to which the assembly is mounted.

7 Claims, 2 Drawing Sheets

PRINT THERMALLY CONDUCTIVE INTERFACE ASSEMBLY

CROSS-REFERENCE TO RELATED APPLICATIONS

This application is related to and is a divisional application of earlier filed patent application Ser. No. 09/904,050, filed Jul. 12, 2001, now U.S. Pat. No. 6,555,486.

BACKGROUND OF THE INVENTION

The present invention relates to an electronic material composition for use in connection with heat generating electronic devices and a method for using the same More particularly, this invention relates to a new elastomeric polymer coating material, containing thermally conductive filler material for forming an improved thermally conductive interface layer, and its method of application to a heat dissipation device for the purpose of transferring waste heat from an electronic heat-generating source.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket, which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In the prior art, heat sinks are commonly placed in thermal communication with the heat-generating device to help dissipate heat therefrom, to avoid the above-described adverse effects due to overheating. Heat sinks are often placed and maintained in direct communication with the heat-generating surface of the device to be cooled. For example, heat sinks are commonly affixed to the top surface of a device and maintained in place by some type of clip or clamp unit. In operation, the heat emanates from the device and to the adjacent heat sink for dissipation into the ambient air.

However, small air gaps or voids are present between the surface of the device to be cooled and the heat sink member. The contact surfaces are not perfectly flat. Due to manufacturing methods, such as machining, of the heat sink, which may be constructed of metal or thermally conductive plastic, there are voids or grooving present, although very small. Also, the surface of the device to be cooled typically has similar imperfections and accompanying air gaps. As a result, when a heat sink is mated with a surface to be cooled, precise flush communication is not possible due to the small air gaps present therebetween and the effectiveness of the heat sink will be degraded because the thermal conductivity of the air in the gaps is less than that of the material of the heat sink itself.

To address the above concerns, various interface materials have been employed in the prior art. In particular, organic base materials such as polysiloxane oils or polysiloxane elastomeric rubbers and thermoplastic materials such as PVC, polypropylene, etc. loaded with thermally conducting ceramics or other fillers such as aluminum nitride, boron nitride or zinc oxide have been used to impart thermally conducting properties to the organic base material. In the case of polysiloxane oils loaded with thermally conducting materials, these materials are applied by smearing the heat sink or other electronic component with the thermally conducting paste and then securing the heat sink in place by mechanical means using clips or screws. In the case of polysiloxane rubbers and thermoplastic polymers, these materials are typically cast in sheet form and die cut into shapes corresponding to the shape of the heat sink and heat generating device. The resulting preformed sheet is then applied to the surface of the heat-generating surface securing the heat sink by means of clips or screws.

Thermal greases are also used to conduct heat in electronic devices. The prior art thermal greases show superior film forming and gap filling characteristics between uneven surfaces thus providing an intimate contact between the surface of the heat sink and the surface of the heat-generating source. However, it has been found that the use of thermal greases exhibit poor adhesions to the surfaces of the heat sink and heat generating surface, thus effectively seeping out from between the heat sink and the heat generating surface, causing air voids to form between the two surfaces leading to hot spots. Moreover, excessive pressure placed upon the heat sink by the mechanical fasteners accelerates this seepage from between the heat sink and the surface of the heat-generating surface. It has been reported that excessive squeeze out of polysiloxane oils can evaporate and recondense on sensitive parts of the surrounding microcircuits. The recondensed oils lead to the formation of silicates thereby interfering with the function of the microprocessor and eventually causing failure.

The precut films solve the problems associated with greases but do not provide adequate intimate contact required for optimum heat transference between the heat generating source and the heat sink. Typical precut films do not show the film forming capacity, as do the thermal greases. The added step of cutting preforms and manually applying the pad adds cost to the assembly process. Furthermore, these types of materials show variable performance due to variation in the thickness of the pad and the amount of pressure applied to the thermally conducting precut film, based upon the mechanical device or action used to secure the heat sink. Further, while these known interface materials, are suitable for filling undesirable air gaps, they are generally are less thermally conductive than the heat sink member thus detracting from the overall thermal conductivity of the assembly.

The prior art in this area includes a silk screen printable acrylate material that is cured with ultra-violet wavelength light. These materials have several drawbacks due to the nature of the materials employed. Once cured, acrylate materials tend to be rather brittle and inflexible providing poor compressibility in applications where the interface must be held in tight contact with the heat generating device thereby bridging small gaps. An additional drawback is the result of the UV curing requirement. UV curing requires specialty equipment including high intensity actinic lamps to produce the proper radiation required to complete the curing process. Not only is the required equipment expensive To cure a product using a able In view of the foregoing, there is a demand for an interface for a heat sink assembly that is capable of both filling the undesirable voids and imperfections in the mating surfaces of a heat sink and the object to be cooled. There is a demand for an interface that can be easily applied to a surface and cured without complex equipment. There is a further demand for a flexible interface material that can accommodate the inherent creep associated with heat sink devices. There is also a demand for an interface to also improve the thermal conductivity of the interface between a heat sink and object to be cooled. In addition, there is a demand for an interface construction that can be installed onto existing heat sink designs in an efficient manner.

SUMMARY OF THE INVENTION

The present invention is generally directed to a novel and unique thermally conductive interface. The present invention provides a new and improved composition for forming a thermally conducting polymeric interface layer or film for use in electronic applications, and a method of applying such material. A compound having an elastomeric base matrix loaded with a thermally conducting filler is used to impart thermally conductive properties to the screen printable coating material system or gel. When cured, this thermally conducting thermal interface, being highly compressible, forms an intimate contact between the heat source and the heat sink. The material composition remains in molten form during application to the substrate material, but includes one or more visible light curable elastomeric materials that are cured via the use of catalysts and visible light into a highly compressible thermal interface. Since this material is thermoset, unlike the prior art, no squeeze out of the material can occur subsequent to curing.

After the material composition is prepared, it is either screen-printed to a film thickness onto the surface of a heat sink or other electronic component, or if a thicker interface is desired, stencil printed and then cured. The resultant film formed upon the heat sink or other device can be controlled to close tolerances, thereby imparting a consistent thickness and accurate placement on the desired part, thereby allowing the uniform transfer of heat. In addition, since the film of the present invention is formed from an elastomeric base material, it is highly compressible, allowing the thermally conductive interface can conform to an uneven surface on the adjacent heat source, effectively filling the slight voids resulting from the manufacturing process. Typical prior art preformed films do not have good compressibility, which results in poor intimate contact between the surface of the heat sink and the heat generating source. Because of the printable nature of this material, variable screen or stencil sizes can be quickly made up when using the thermal interface material of the present invention. The film can be applied during the heat sink manufacturing process and thus eliminates the need for an additional step during assembly. The interface pad formed by the material of the present invention is substantially noncorrosive and it will not creep or bleed-out under applied pressure.

In addition, the present invention is greatly advantageous over the prior art because it is visible light curable. This feature is an improvement over the prior art interfaces that require the use of ultra-violet (UV) wavelength light for the curing step. For UV curing a special light source is required and extensive safety measures need to be employed to protect the operator from exposure to dangerous levels of UV radiation. Visible light curing allows the film to be applied and cured using conventional light sources and eliminates the hazard for the operator.

It is therefore an object of the present invention to provide a thermally conductive interface construction for a heat sink assembly that is substantially compressible and can fill the voids and imperfections on the surfaces of the heat sink and object to be cooled.

It is also an object of the present invention to provide a thermally conductive interface construction for a heat sink assembly that has a high thermal conductivity.

It is an object of the present invention to provide a thermally conductive interface construction for a heat sink assembly that is easily applied to a wide array of heat sink applications, thus eliminating an additional assembly step.

It is a further object of the present invention to provide a thermally conductive interface construction for a heat sink assembly that solves the problems associated with the prior art.

Other objects, features and advantages of the invention shall become apparent as the description thereof proceeds when considered in connection with the accompanying claims.

BRIEF DESCRIPTION OF THE DRAWINGS

The novel features characteristic of the present invention are set forth in the appended claims. However, the preferred embodiments of the invention, together with further objects and attendant advantages, are best understood by reference to the following detailed description taken in connection with the accompanying drawings in which:

DETAILED DESCRIPTION OF THE PREFERRED EMBODIMENT

Figure 1:
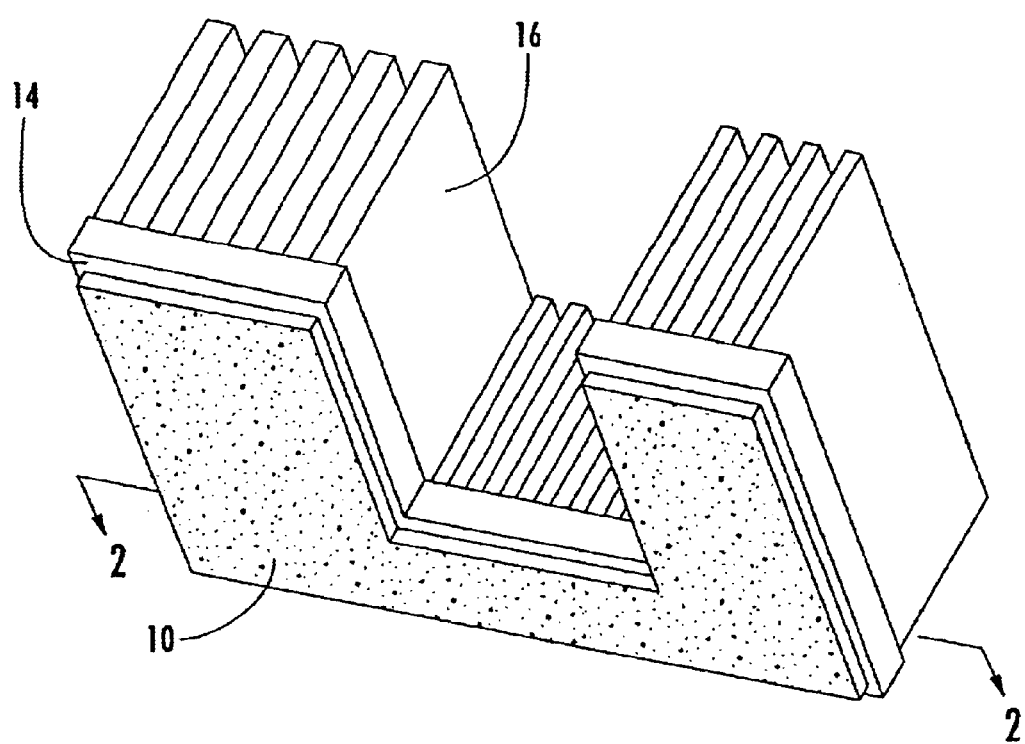
FIG. 1 is a perspective view of the thermally conductive interface assembly of the present invention.
Figure 2:
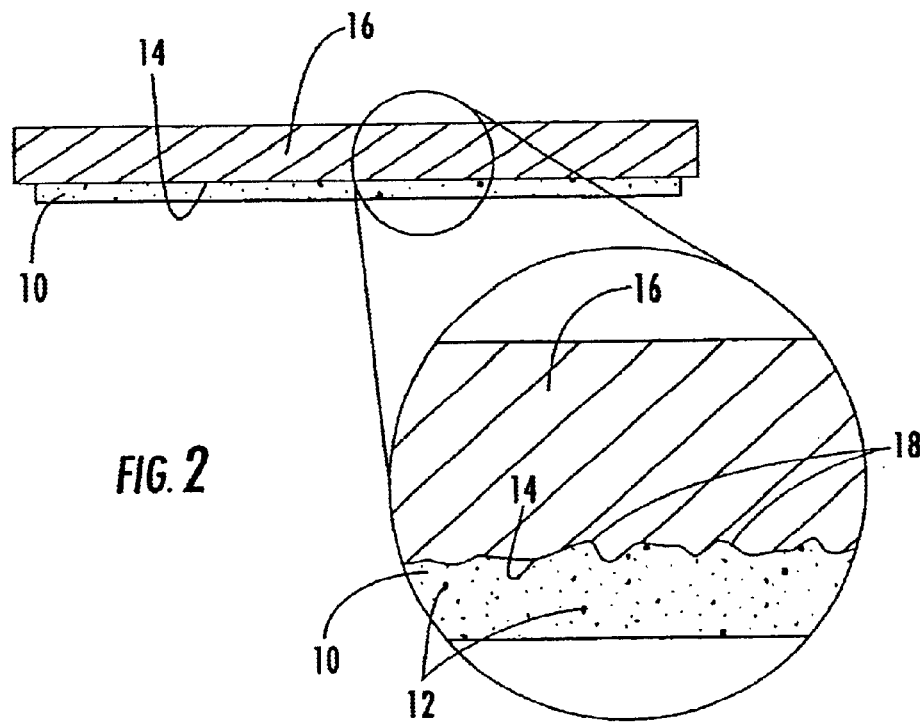
FIG. 2 is a cross-sectional view thereof taken along the line 2—2 shown in FIG. 1.
Figure 3:
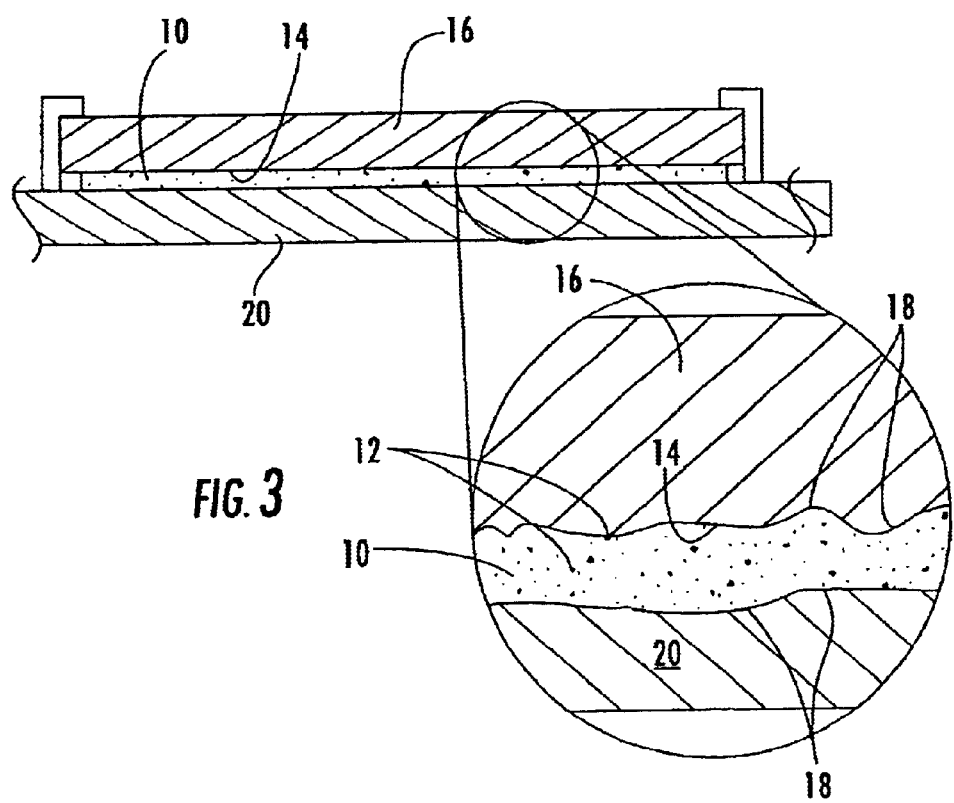
FIG. 3 is a cross-sectional view thereof showing the assembly in relation to a heat-generating device.

The thermally conductive material composition of the present invention comprises a visible light curable elastomeric material, a catalyst, a thermally conductive filler and a hydrocarbon solvent. In the preferred embodiment the visible light curable composition comprises by weight from about 35% to about 75% of a visible light curable elastomeric material, from about 0.5% to about 15% catalyst, from about 10% to about 30% hydrocarbon solvent and from about 20% to about 70% conductive filler. The amount of hydrocarbon solvent added is controlled by the required viscosity of the resultant material in order to facilitate screen or stencil printing while maintaining sufficient viscosity to stay in place on the substrate at the desired layer thickness without Turning now to FIGS. 1–3, the present composition is formed by first providing an elastomeric base polymer matrix 10. The elastomeric material 10 selected has visible light curable properties. This feature of the present invention is important in that it is an improvement over the prior art. The use of visible light for curing has several advantages. Use of visible light for curing eliminates required use of specialized, high-powered lamps with emissions in the UV range. In addition, this eliminates the need for elaborate enclosures around the lights to shield the operator and other personnel on the manufacturing floor from UV radiation emissions. In contrast, the present invention allows the curing process to occur under standard visible light that will not harm the operating personnel in the event that they are exposed. However it is possible that a formulation of the present invention may be cured using UV light curing equipment. This feature may be desirable if a user already has existing UV light curing equipment and will obviate the need to purchase additional equipment.

The selection of an elastomeric base polymer for the present invention is another important aspect of the present invention. Since the finished product will have the characteristics found in elastomers, it will have much greater flexibility and compressibility as compared to the prior art thermal transfer interface products. In the heat transfer industry the electronic devices being served continue to produce greater and greater amounts of heat while the space allowed for cooling solutions is continually being reduced. As a result, smaller, thinner, highly efficient and precise solutions must be developed. The prior art used for manufacturing such heat transfer and dissipation systems does not provide the precision required to allow highly efficient heat transfer. The component parts used for heat transfer are either machined or die cast metals or injection molded, thermally conductive plastics. The surfaces of these materials generally have small imperfections 18 such as milling marks that result in small gaps between the mating surfaces. Since these gaps 18 contain air the resultant thermal transfer between the heat generating device 20 and the heat dissipating device 16 is reduced. The elastomeric material 10 allows for a flexible and very compressible transfer interface to be installed on the heat sink 16 that conforms to the surface imperfections eliminating the gaps 18 and providing efficient heat transfer.

The elastomeric base material 10 is loaded with a thermally conductive filler material 12 to facilitate thermal conductivity throughout the finished composition. Thermally conductive fillers 12 suitable for use in the present invention include, for example, particles of boron nitride, the preferred filler in this invention, but also include aluminum nitride and alumina, as well as carbon materials such as carbon fiber. Mixtures of such materials may also be utilized. It will be appreciated that the particular conductive filler 12 that is utilized is generally a function of the particular application for the conductive composition including for example, the amount of heat that must be transferred from the heat generating electronic device.

The present invention also employs a catalyst to allow the composition to cure to a solid state after being applied to the desired surface. A preferred catalyst is selected from the group consisting of 1-hydroxycyclohexyl phenyl ketone, 2-methyl-1-4-(methylthio)phenyl!-2-morpholinopropan-1-one, benzophenone, 2-benzyl-2-N,N-dimethylamino-1-(4-morpholinophenyl)-1-butanone, 2,2-dimethoxy-2-phenyl acetophenone, bis(2,6-dimethoxybenzoyl-2,4-,4-trimethyl pentyl) phosphine oxide, 2-hydroxy-2-methyl-1-phenyl-propan-1-one, 2-hydroxy-2-methyl-1-phenyl-1-propane, 2,4,6-trimethylbenzoyldiphenyl-phosphine oxide, 2-hydroxy 2-methyl-1-phenyl-propan-1-one, mixed triaryl sulfonium hexafluoroantimonate salts, mixed triaryl sulfonium hexafluorophosphate salts, visible light photoinitiators. dl-camphorquinone, and combinations thereof. The viscous mixture is applied to the desired heat transfer surface 14 using either a screen printing or stencil printing process and is subsequently exposed to a source of visible light to cure the material. This leaves a compressible film 10 on the heat transfer surface 14 of the heat transfer device 16 that has the desired thickness and flexibility while remaining in place throughout shipment and final assembly of the device in a finished product.

Finally, the composition 10 also contains a hydrocarbon solvent. Such a hydrocarbon solvent that can be used is an aromatic hydrocarbon solvent sold under the trade designation Aromatic 100 by Union Carbide of Danbury, Conn. Another suitable hydrocarbon solvent includes the ISOPAR series of solvents sold by Exxon Chemical of Houston, Tex. The amount of solvent employed in mixing the material is selected depending on the viscosity required for effective printing. The present invention is intended to be used in a screen or stencil printing operation, whereby a substantial film thickness is developed on the surface 14 of the part 16 before the curing operation. The material composition 10 must be thin enough to allow printing but thick enough to maintain a film thickness without sagging or slumping prior to curing. In addition, the solvent serves to facilitate the complete wetting of the conductive fillers 12. The solvent also allows high loading of the fillers 12 in the material composition 10. High loading of the fillers 12 provides superior heat transfer properties as well as superior physical properties.

Reaction (cross linking) of the elastomeric polymer materials 10 is initiated upon exposure to high intensity visible light. Initiation of the free radical polymerization occurs upon absorption of light by the catalysts or initiators. In addition, thermal catalysts or initiators help to perpetuate the crosslinking reaction in shadow covered areas or areas blocked by the conductive filler 12. The curing parameter of the material composition 10 depends on factors such as applied thickness, environmental conditions and energy levels of the light source. However, the material composition generally cures in a few seconds.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A method of manufacturing a thermal interface for conducting heat, comprising:
   providing a viscous elastomeric material;
   mixing a visible light curable catalyst throughout said elastomeric material;
   mixing a thermally conductive filler material throughout said elastomeric material;
   applying a layer of said viscous elastomeric material to a heat dissipating surface in an uncured state; and
   curing said layer of elastomeric material by exposing said layer of elastomeric materiel to visible wavelength light, wherein said thermal interface remains compressible when placed into contact with a heat-generating device.

2. The method of claim 1, said elastomeric material comprising by weight:
   an elastomeric base matrix between approximately 35 and 75 percent;
   a visible light curable catalyst between about 0.5 to 15 percent; and
   a hydrocarbon solvent between about 10 to 30 percent.

3. The method of claim 1, wherein said thermally conductive filler material is boron nitride.

4. The method of claim 1, wherein said thermally conductive filler material is alumna.

5. The method of claim 1, wherein said heat dissipating surface is the surface of a heat sink.

6. The method of claim 1, wherein said step of applying said viscous elastomeric material includes applying said material to said heat dissipating surface by screen printing.

7. The method of claim 1, wherein said step of applying said viscous elastomeric material includes applying said material to said heat dissipating surface by stencil printing.

* * * * *